US011977128B2

(12) United States Patent
Tanno et al.

(10) Patent No.: US 11,977,128 B2
(45) Date of Patent: May 7, 2024

(54) USED BATTERY UNIT DEPOSITORY

(71) Applicant: Toyo System Co., Ltd., Fukushima (JP)

(72) Inventors: Satoshi Tanno, Fukushima (JP); Hideki Shoji, Fukushima (JP)

(73) Assignee: TOYO SYSTEM CO., LTD., Fukushima (JP)

( * ) Notice: Subject to any disclaimer, the term of this patent is extended or adjusted under 35 U.S.C. 154(b) by 0 days.

(21) Appl. No.: 17/606,869

(22) PCT Filed: Feb. 22, 2021

(86) PCT No.: PCT/JP2021/006636
§ 371 (c)(1),
(2) Date: Oct. 27, 2021

(87) PCT Pub. No.: WO2021/205766
PCT Pub. Date: Oct. 14, 2021

(65) Prior Publication Data
US 2023/0024279 A1 Jan. 26, 2023

(30) Foreign Application Priority Data

Apr. 10, 2020 (JP) ................. 2020-071274

(51) Int. Cl.
*G01R 31/396* (2019.01)
*G01R 31/387* (2019.01)
*H02J 7/00* (2006.01)

(52) U.S. Cl.
CPC ......... *G01R 31/396* (2019.01); *G01R 31/387* (2019.01); *H02J 7/0014* (2013.01)

(58) Field of Classification Search
None
See application file for complete search history.

(56) References Cited

U.S. PATENT DOCUMENTS

| 2009/0015193 A1* | 1/2009 | Esaka | H02J 7/0069 320/103 |
| 2013/0002026 A1* | 1/2013 | Mizutani | H02J 7/0071 307/65 |

(Continued)

FOREIGN PATENT DOCUMENTS

| CN | 110712529 A | 1/2020 |
| EP | 1868839 A1 | 12/2007 |

(Continued)

OTHER PUBLICATIONS

International Search Report dated Apr. 13, 2021 re PCT/JP2021/006636 (original with English translation, 4 pages).

(Continued)

*Primary Examiner* — Jas A Sanghera
(74) *Attorney, Agent, or Firm* — Holtz, Holtz & Volek PC

(57) ABSTRACT

Provided is a storage for used battery units capable of economically storing a plurality of used battery units of various manufacturers while suppressing the deterioration of the used battery units during storage. The storage for used battery units includes: a selection unit that selects a discharge target battery unit and a charge target battery unit from among the plurality of used battery units on the basis of the current values and the voltage values of the plurality of used battery units in storage and the predetermined SOC range of each of the plurality of used battery units; and a charge/discharge control unit which causes a discharge target battery unit to be discharged and charges the discharged power into a charge target battery unit such that the SOCs of the discharge target battery unit and the charge target battery unit reach a predetermined SOC range.

5 Claims, 7 Drawing Sheets

(56) References Cited

U.S. PATENT DOCUMENTS

| | | | |
|---|---|---|---|
| 2014/0167657 A1* | 6/2014 | Nishikawa | B60L 58/15 320/134 |
| 2017/0229878 A1 | 8/2017 | Kim et al. | |
| 2019/0067959 A1 | 2/2019 | Burden | |
| 2019/0132799 A1 | 5/2019 | Lippman | |
| 2022/0340043 A1 | 10/2022 | Qin | |

FOREIGN PATENT DOCUMENTS

| | | |
|---|---|---|
| JP | 2000113909 A | 4/2000 |
| JP | 2017079131 A | 4/2017 |
| JP | 2018093614 A | 6/2018 |

OTHER PUBLICATIONS

Extended European Search Report (EESR) dated Dec. 19, 2022, issued in counterpart European Application No. 21785550.1.
Chinese Office Action (and an English language translation thereof) dated Sep. 21, 2023, issued in counterpart Chinese Application No. 202180003071.5.

* cited by examiner

FIG.3

| USED BATTERY UNIT ID | SOC LOWER LIMIT VALUE | SOC UPPER LIMIT VALUE |
|---|---:|---:|
| BUa | 50% | 60% |
| BUb | 55% | 65% |
| BUc | 50% | 70% |
| : | : | : |

FIG.4

| ACQUISITION DATE & TIME | USED BATTERY UNIT ID | DETERIORATION STATE (SOH) |
|---|---|---:|
| 2020/3/28 ○:○:○ | BUa | 90% |
| 2020/3/28 ○:○:○ | BUb | 89% |
| 2020/3/28 ○:○:○ | BUc | 87% |
| : | : | : |
| 2020/3/29 ○:○:○ | BUa | 90% |
| 2020/3/29 ○:○:○ | BUb | 88% |
| 2020/3/29 ○:○:○ | BUc | 87% |
| : | : | : |

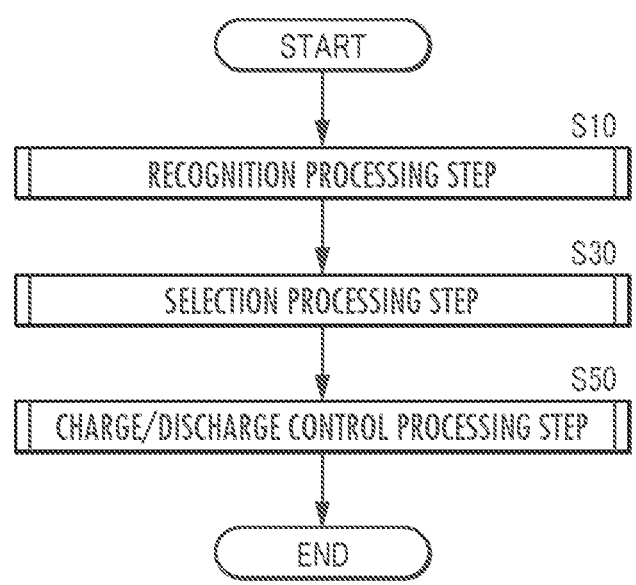

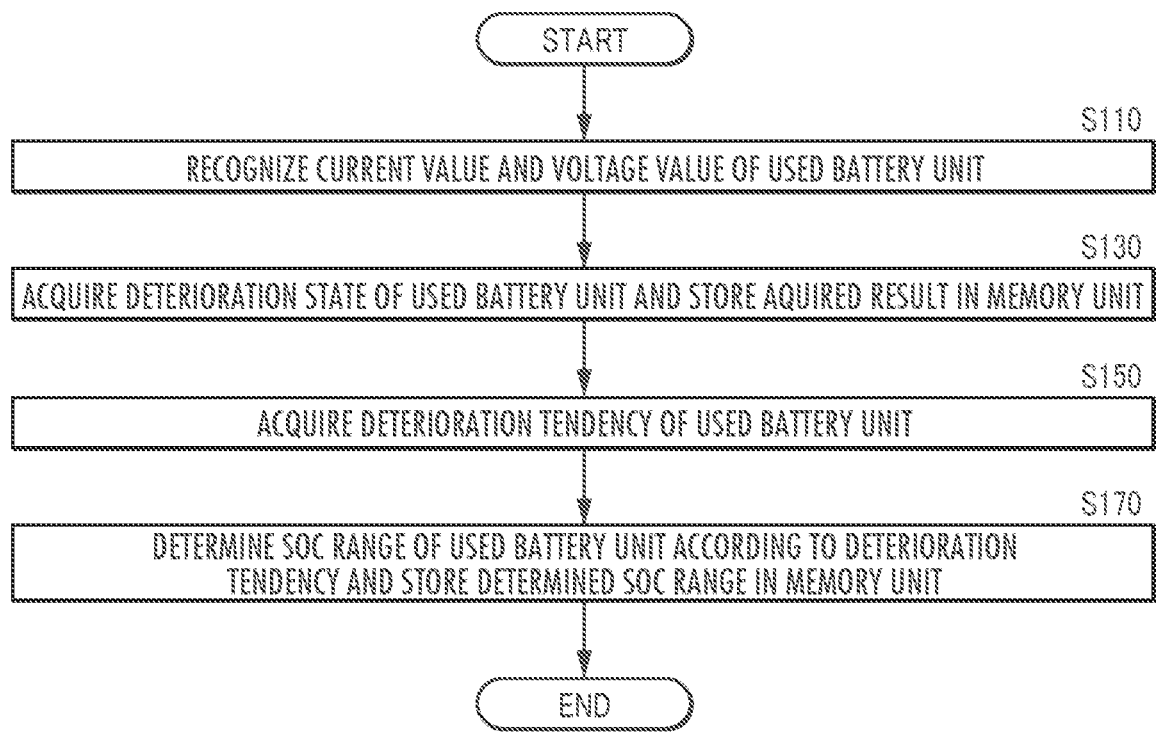

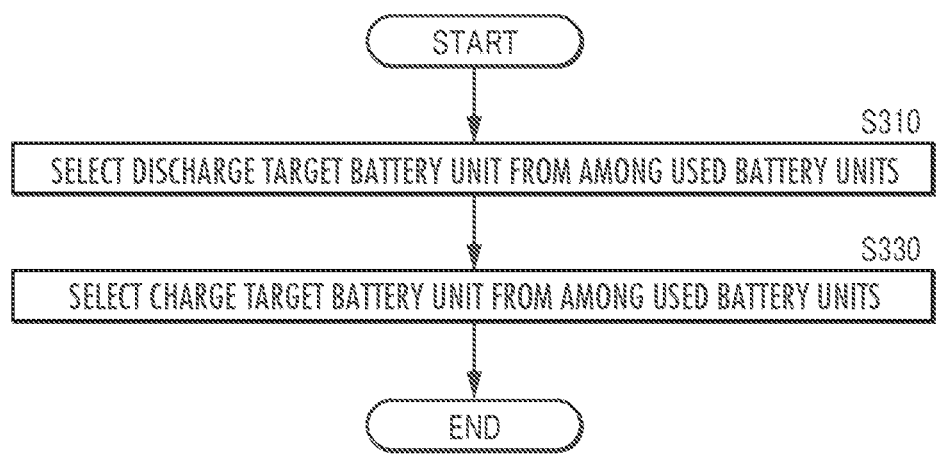

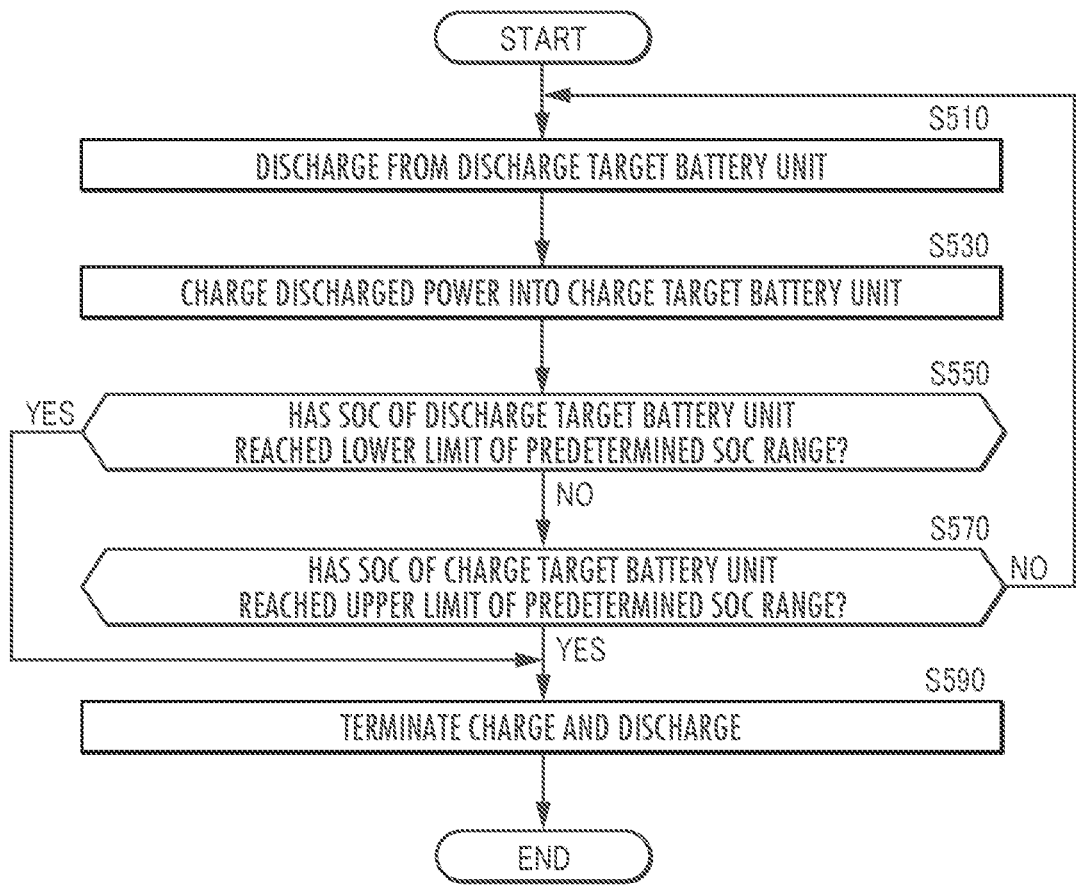

USED BATTERY UNIT DEPOSITORY

CROSS-REFERENCE TO RELATED APPLICATIONS

This patent application is a U.S. National Stage filing of, and claims priority to and all advantages of, PCT Patent Publication Number PCT/JP2021/006636 filed on Feb. 22, 2021 and Japanese Patent Application No. 2020-071274 filed on Apr. 10, 2020, the contents of both of which are incorporated herein by reference in their entireties.

TECHNICAL FIELD

The present invention relates to a storage for used battery units.

BACKGROUND ART

Hitherto, a storage for batteries has been proposed (refer to Patent Literature 1).

CITATION LIST

Patent Literature

Patent Literature 1: Japanese Patent Application Laid-Open No. 2000-113909

SUMMARY OF INVENTION

Technical Problem

According to the technology of Patent Literature 1, deterioration of a battery in storage can be suppressed by repeatedly charging and discharging the battery in storage.

The technology of Patent Literature 1 can conceivably be applied to a storage for storing used battery units in order to conduct a reuse business of used battery units.

In order to conduct a reuse business of used battery units, a certain number of used battery units are to be collected and stored.

Further, it is necessary to store used battery units such that the used battery units do not deteriorate during storage, and for this purpose, the SOCs of the used battery units need to be properly managed.

In order to properly manage the SOCs of used battery units, it is necessary to charge or discharge the used battery units so that the SOCs thereof reach a predetermined SOC range according to the characteristics of each of the used battery units, but it is not economical to wastefully consume power at discharging or to incur electricity cost at charging.

However, the technology of Patent Literature 1 does not give considerations to effectively utilizing the electric power at discharging or suppressing the electricity cost at charging.

Further, the used battery units are provided with BMU (Battery Management Unit), CCU (Cell Control Unit), and the like for each manufacturer as a mechanism for recognizing the SOCs of the battery units, but the interfaces of these BMU and CCU are usually not open to the public.

The technology of Patent Literature 1 does not take this factor into account, so that the SOCs of used battery units cannot be properly recognized and managed, consequently failing to suppress deterioration during storage.

An object of the present invention is, therefore, to provide a storage for used battery units that is capable of economically storing a plurality of used battery units while suppressing the deterioration of the used battery units of various manufacturers during storage.

Solution to Problem

A storage for used battery units in accordance with the present invention is
a storage for storing a plurality of used battery units, including:
a memory unit that stores a predetermined SOC (State of Charge) range according to characteristics of each of the plurality of used battery units;
a connection circuit that electrically connects the plurality of used battery units with each other;
a recognition unit which is connected to the plurality of used battery units in storage and which recognizes a current value and a voltage value of each thereof;
a selection unit that selects a discharge target battery unit to be discharged and a charge target battery unit to be charged from among the plurality of used battery units on the basis of a recognition result by the recognition unit and the predetermined SOC range of each of the plurality of used battery units stored in the memory unit; and
a charge/discharge control unit which causes the discharge target battery unit to be discharged and causes the discharged power to be charged into the charge target battery unit such that the SOCs of the discharge target battery unit and the charge target battery unit reach the predetermined SOC range.

According to the storage for used battery units in accordance with the present invention, the current value and the voltage value of each used battery unit are recognized by the recognition unit connected to the plurality of used battery units in storage.

With this arrangement, the current value and the voltage value of each of the plurality of used battery units can be recognized even if an interface of the BMU, CCU, or the like installed beforehand in a used battery unit is not open to the public.

Consequently, the SOCs of used battery units of various manufacturers can be recognized and the used battery units can be charged or discharged such that the SOC of each of the used battery units becomes within a predetermined SOC range according to the characteristics of each of the used battery units, thus making it possible to suppress the deterioration of the used battery units.

Further, the charge/discharge control unit charges the power discharged from the discharge target battery units into the charge target battery units.

This is economical because the power used to charge the used battery units in the storage is covered by the power from discharging other used battery units.

Thus, according to the storage for used battery units in accordance with the present invention, a plurality of used battery units can be economically stored while suppressing the deterioration of used battery units of various manufacturers during storage.

Preferably, the storage for used battery units in accordance with the present invention includes:
a charge unit which is electrically connected to the connection circuit and charges the plurality of used battery units,
wherein the selection unit is configured to select the charge unit as a power source supplying power that covers insufficient power in the case where the amount of power discharged from the discharge target battery unit is insufficient for the amount of power required to charge the charge target battery unit to the predetermined SOC range, and the charge/discharge control unit is configured to cause the discharge target battery unit to be discharged or the charge unit to be discharged and to charge the discharged power into the charge target battery unit such that the SOCs of the discharge target battery unit and the charge target battery unit reach the predetermined SOC range.

According to the storage for used battery units in accordance with the present invention, if the amount of power required to charge a charge target battery unit to a predetermined SOC range is insufficient, then power to cover the insufficiency is supplied from the charge unit.

This increases the reliability that each used battery unit will be charged or discharged to be within a predetermined SOC range thereof, and also increases the reliability that the deterioration of used battery units can be suppressed.

In addition, since only the power covering the insufficiency needs to be supplied from the charge unit, the amount of power supplied from a power source other than the used battery units in the storage is minimized, making it economical.

Thus, the storage for used battery units in accordance with the present invention makes it possible to economically store a plurality of used battery units while reliably suppressing the deterioration of used battery units of various manufacturers during storage.

Preferably, the storage for used battery units in accordance with the present invention includes:

a power output unit which is electrically connected to the connection circuit and outputs power supplied from the plurality of used battery units;

wherein the selection unit is configured such that, in the case where the amount of power to be discharged from the discharge target battery unit exceeds the amount of power required to charge the charge target battery unit to an upper limit of the predetermined SOC range thereof, the power output unit is selected as a target to which the excess power is supplied, and the charge/discharge control unit is configured to cause the discharge target battery unit to be discharged, and to charge the discharged power into the charge target battery unit or supply the discharged power to the power output unit such that the discharge target battery unit and the charge target battery unit reach the predetermined SOC range.

According to the storage for used battery units in accordance with the present invention, if there is an excess of power required to bring the charge target battery unit within the predetermined SOC range, the excess power is output from the power output unit.

This increases the reliability that each used battery unit will be charged or discharged to be within a predetermined SOC range thereof, and also increases the reliability that the deterioration of used battery units can be suppressed.

Further, it is economical since excess power can be output from the power output unit and used for other purposes, thus not wasting the excess power.

As described above, the storage for used battery units in accordance with the present invention makes it possible to economically store a plurality of used battery units while reliably suppressing the deterioration of used battery units of various manufacturers during storage.

Preferably, the storage for used battery units in accordance with the present invention includes:

a power output unit which is electrically connected to the connection circuit and which receives power supplied from the plurality of used battery units and outputs the received power; and a power output instruction reception unit which accepts input of a power output instruction from the power output unit by a user, wherein the selection unit is configured such that, in the case where the input of the output instruction is accepted by the power output instruction reception unit, the used battery unit having a highest SOC among the plurality of used battery units is selected as the discharge target battery unit, and the power output unit is selected as a target to which power discharged from the discharge target battery unit is supplied, and the charge/discharge control unit is configured to cause the discharge target battery unit to discharge to be within a SOC range of the discharge target battery unit, and to supply the discharged power to the power output unit.

According to the storage for used battery units in accordance with the present invention, the power output instruction reception unit accepts the input of a power output instruction from the power output unit in response to an operation by a user.

Further, when the input of an output instruction is accepted, the selection unit selects a used battery unit having a highest SOC as a discharge target battery unit from among a plurality of used battery units, and selects the power output unit as a target to which the power discharged from the discharge target battery unit is supplied.

Consequently, discharge can be performed at any timing according to an operation by a user. Further, by discharging a used battery having a higher SOC, that is, having a larger remaining capacity, it is possible to reduce the frequency of switching of a discharge target battery due to the used battery running out of capacity, thus increasing the possibility of a stable supply of power to an external power load or the like, to which power is to be output from the power output unit, for an extended period of time. This is economical since the power that can be discharged can be effectively used for necessary applications at any time.

Further, when discharging from a battery, if a large current is discharged, the load on the battery increases, which is a factor in accelerating the deterioration of the battery.

A battery with a high SOC has a high voltage and can reduce current when discharging, so that discharging from a battery with a high SOC leads to a smaller load on the battery than discharging from a battery with a low SOC, thus effectively suppressing battery deterioration.

The storage for used battery units in accordance with the present invention is adapted to preferentially select a battery unit with a higher SOC as the battery unit to be discharged, so that the load on the used battery to be discharged is minimized, thus effectively suppressing the deterioration of the battery.

Thus, according to the storage for used battery units in accordance with the present invention, a plurality of used battery units of various manufacturers can be economically stored while effectively suppressing the deterioration of the used battery units during storage.

In the storage for used battery units in accordance with the present invention, the charge/discharge control unit is preferably configured to supply power, which has been supplied to the power output unit, as power required for operating the storage for used battery units.

According to the storage for used battery units in accordance with the present invention, the power supplied to the power output unit is supplied by the charge/discharge control unit as the power required for operating the storage for used battery units.

This is economical since the power output from the power output unit can be used as the power required for operating the storage for used battery units, so that excess power is not wasted.

Thus, according to the storage for used battery units in accordance with the present invention, a plurality of used battery units of various manufacturers can be economically stored while effectively suppressing the deterioration of the used battery units during storage.

The storage for used battery units in accordance with the present invention preferably includes:

a deterioration state acquisition unit that acquires a deterioration state of each of the plurality of used battery units and stores the acquired deterioration state in chronological order in the memory unit;

a deterioration tendency acquisition unit that acquires a deterioration tendency of each of the plurality of used battery units on the basis of the deterioration state stored in chronological order; and a SOC range determination unit that regularly or irregularly determines the predetermined SOC range of each of the plurality of used battery units according to the deterioration tendency of each of the plurality of used battery units, and stores, in the memory unit, the predetermined SOC range that has been determined.

The SOC range for suppressing deterioration is expected to be different for each used battery unit.

According to the storage for used battery units in accordance with the present invention, the deterioration state acquisition unit acquires the deterioration state of each of the plurality of used battery units and stores the acquired deterioration state in the memory unit in chronological order.

Then, the deterioration tendency acquisition unit acquires the deterioration tendency of each of the plurality of used battery units on the basis of the deterioration state stored in chronological order.

Further, the SOC range determination unit regularly or irregularly determines the predetermined SOC range of each of the plurality of used battery units according to the deterioration tendency of each of the plurality of used battery units, and stores, in the memory unit, the predetermined SOC range that has been determined.

Consequently, the predetermined SOC range of each of the plurality of used battery units is regularly or irregularly reviewed by taking into account the deterioration tendency of each of the plurality of used battery units, thus enhancing the reliability of suppressing the deterioration of the used battery units.

As described above, the storage for used battery units in accordance with the present invention makes it possible to economically store a plurality of used battery units of various manufacturers while reliably suppressing the deterioration of the used battery units during storage.

BRIEF DESCRIPTION OF DRAWINGS

FIG. 3 is a diagram illustrating the details of data used for processing by the storage for used battery units in accordance with the present invention;

FIG. 4 is a diagram illustrating the details of data used for processing by the storage for used battery units in accordance with the present invention;

FIG. 5 is a flowchart illustrating the details of the processing by the storage for used battery units in accordance with the present invention;

FIG. 6 is a flowchart illustrating the details of the processing by the storage for used battery units in accordance with the present invention;

FIG. 7 is a flowchart illustrating the details of the processing by the storage for used battery units in accordance with the present invention; and FIG. 8 is a flowchart illustrating the details of the processing by the storage for used battery units in accordance with the present invention.

DESCRIPTION OF EMBODIMENTS

<Configuration of a Storage for Used Battery Units>

Figure 1:
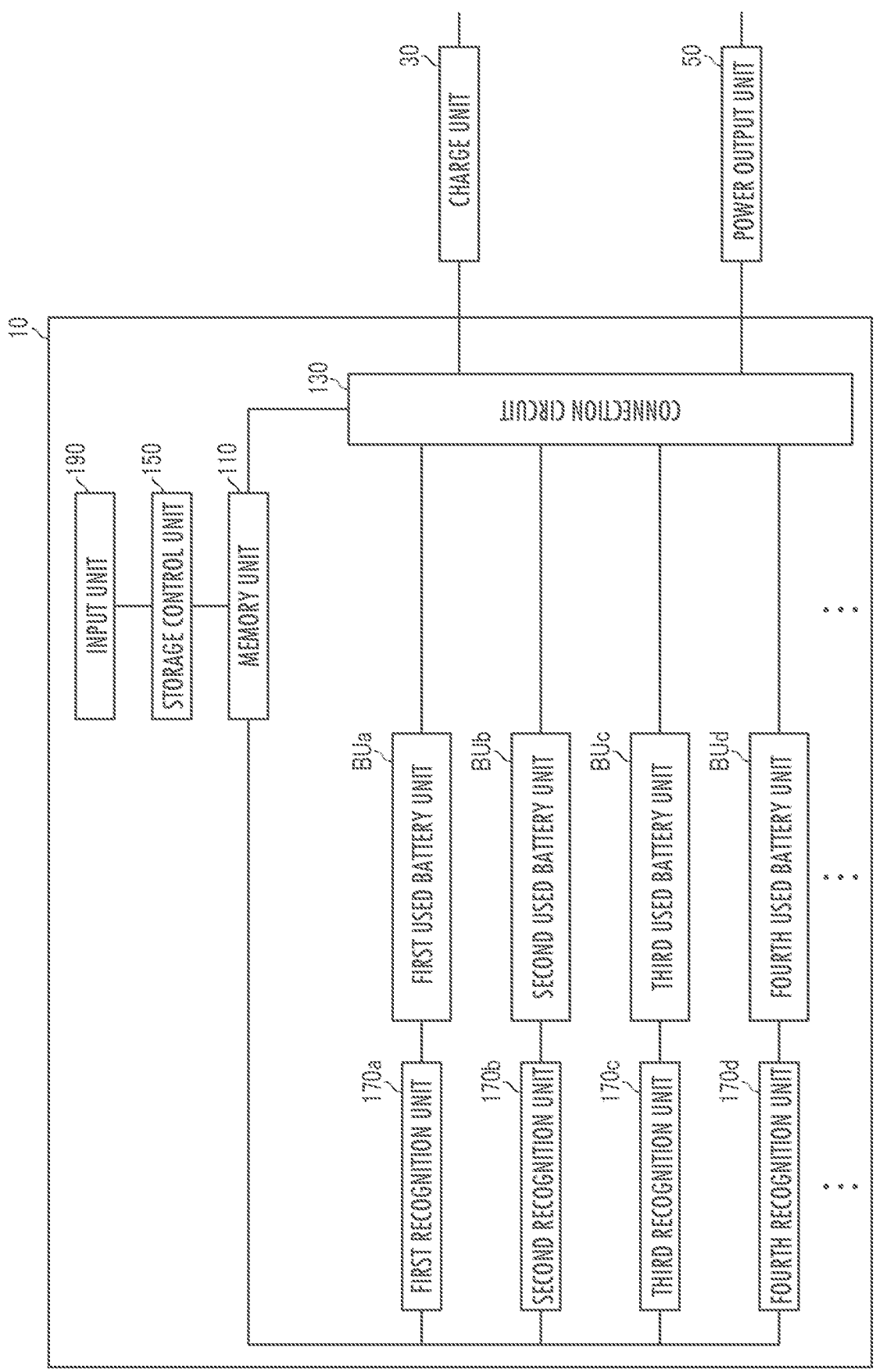
FIG. 1 is a block diagram illustrating an overall view of the storage for used battery units in accordance with the present invention.
Figure 2:
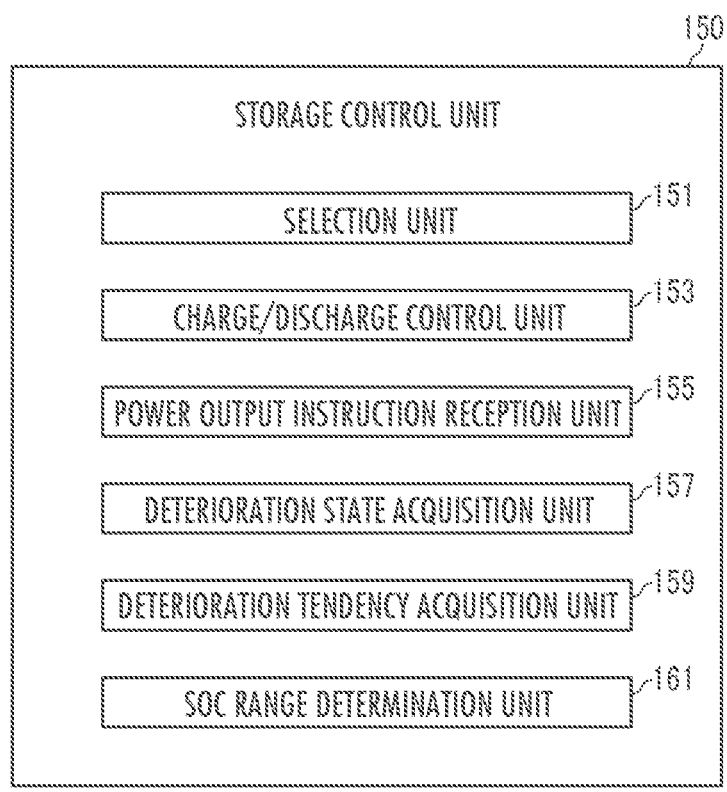
FIG. 2 is a block diagram illustrating an overall view of a storage control unit in accordance with the present invention.

Referring first to FIG. 1 to FIG. 4, a description will be given of the configuration of a storage for used battery units of the present embodiment. The same components will be assigned the same reference numerals, and the descriptions thereof may be omitted.

The storage for used battery units of the present embodiment is a storage which stores a plurality of used battery units BU (BUa, BUb, BUc . . . ) and is configured by including a storage main body 10, a charge unit 30, and a power output unit 50.

The storage main body 10 is configured by including a memory unit 110, a connection circuit 130, a storage control unit 150, recognition units 170, and an input unit 190.

The memory unit 110 is constituted of memory devices, such as a ROM (Read Only Memory), a RAM (Random Access Memory), and an HDD (Hard Disk Drive).

The memory unit, 110 stores, for example, information on a predetermined SOC (State of Charge) range based on the characteristics of each of a plurality of used battery units BU, and stores information on the deterioration state of each of the plurality of used battery units BU in chronological order.

The information on the SOC range includes used battery unit IDs that identify the used battery units BU and the information of the lower limit value and the upper limit value of SOC based on the characteristics of each of the used battery units BU as illustrated in, for example, FIG. 3.

The information on the SOC range may be stored in the memory unit 110 by a user inputting the information through the input unit 190 when, for example, starting to store each used battery unit BU, or the SOC range determination unit 161, for example, may be configured to determine the SOC range of a used battery unit BU on the basis of the information on the manufacturer, the model number, the charge capacity, the time of manufacture, the usage history, the deterioration state, and the like of the used battery unit BU, and store the determined SOC range in the memory unit 110.

The information on the deterioration state of each of the plurality of used battery units BU includes information of the date and time when the deterioration state is acquired, the used battery unit IDs, and the values of the SOH (State of Health) of the used battery units BU as illustrated in, for example, FIG. 4.

The connection circuit 130 is, for example, a DC bus that electrically connects a plurality of used battery units BU with each other.

The storage control unit 150 is constituted of an arithmetic processing unit, such as a CPU (Central Processing Unit), a memory, I/O (Input/Output) devices, and the like.

The storage control unit 150 reads and executes predetermined programs thereby to function as, for example, the selection unit 151, the charge/discharge control unit 153, the power output instruction reception unit 155, the deterioration state acquisition unit 157, the deterioration tendency acquisition unit 159, and the SOC range determination unit 161.

The selection unit 151 selects a discharge target battery unit DBU to be discharged and a charge target battery unit CBU to be charged from among a plurality of used battery units BU on the basis of a recognition result obtained by the recognition unit 170 and the predetermined SOC range of each of the plurality of used battery units BU stored in the memory unit 110.

The charge/discharge control unit 153 causes the discharge target battery unit DBU to be discharged and charges the discharged power into the charge target battery unit CBU such that the SOCs of the discharge target battery unit DBU and the charge target battery unit CBU reach a predetermined SOC range.

The power output instruction reception unit 155 accepts a power output instruction from the power output unit 50 input by the user of the storage for used battery units.

The deterioration state acquisition unit 157 acquires the deterioration state of each of the plurality of used battery units BU and stores the acquired deterioration state in the memory unit 110 in chronological order.

The deterioration tendency acquisition unit 159 acquires the deterioration tendency of each of the plurality of used battery units BU on the basis of the deterioration state of each of the plurality of used battery units BU stored in the memory unit 110 in chronological order.

The SOC range determination unit 161 regularly or irregularly determines the predetermined SOC range of each of the plurality of used battery units BU according to the deterioration tendency of each of the plurality of used battery units BU and stores the predetermined SOC range, which has been determined, in the memory unit 110.

The recognition units 170 (170a, 170b, 170c, . . . ) are connected to the plurality of used battery units BU in storage to recognize the current value and the voltage value of each of the used battery units BU. The recognition units 170 are, for example, BMUs and CCUs including sensors that recognize the current value and the voltage value of each of the used battery units BU. In the case where, for example, each of the plurality of used battery units BU is provided with BMU or CCU in advance, the recognition units 170 bypass the BMU or CCU and recognize the current value and the voltage value of each of the used battery units BU.

The input unit 190 is, for example, a keyboard or a touch panel, a mouse or other pointing device, which accepts inputs by a user.

The charge unit 30 is, for example, a storage battery electrically connected to the connection circuit 130 to charge the plurality of used battery units BU, and is an AC adapter connected to a power source.

The power output unit 50 is, for example, an inverter which is electrically connected to the connection circuit 130, and receives the power supplied from a plurality of used battery units BU and outputs the power to supply the power to a load in a facility where the storage for used battery units is installed, or to the storage for used battery units itself.

Alternatively, the storage main body 10 may be provided with, for example, a screen that displays images based on the information (the deterioration state, the deterioration tendency, and the like) of each of the plurality of used battery units BU stored in the storage for used battery units, or a speaker that plays audio.

<Outline of Processing>

A description will now be given of the details of processing by the storage for used battery units of the present embodiment. Referring first to FIG. 5 to FIG. 8, a series of processing steps performed by the storage for used battery units will be described.

The storage for used battery units repeatedly performs the series of processing steps at, for example, a predetermined frequency. Alternatively, the storage for used battery units starts the series of processing steps at any timing in response to a user's operation.

Upon a start of the series of processing steps, the storage for used battery units of the present embodiment first performs a recognition processing step (S10 of FIG. 5). Thereafter, the storage for used battery units performs a selection processing step (S30 of FIG. 5), performs charge/discharge control processing step (S50 of FIG. 5), and terminates the series of processing steps. The details of these processing steps will be described below.

<Recognition Processing Step>

When the recognition processing step is started, the recognition units 170 (170a, 170b, 170c and so on) recognize the current values and the voltage values of the used battery units BU (BUa, BUb, BUc and so on) to which the recognition units 170 are individually connected (S110 of FIG. 6). The recognition units 170 may also recognize the temperatures of the used battery units BU, as necessary.

Thereafter, the deterioration state acquisition unit 157 acquires the deterioration state of each of the plurality of used battery units BU and stores the acquired deterioration states in the memory unit 110 in chronological order (S130 of FIG. 6). Various methods can be adopted as a method for acquiring the deterioration state of each of the plurality of used battery units BU.

In the present embodiment, the SOH of each of the plurality of used battery units BU is acquired as the deterioration state on the basis of, for example, the current value, the voltage value, or further the temperature of each of the plurality of used battery units BU recognized by the recognition units 170.

Subsequently, the deterioration tendency acquisition unit 159 acquires the deterioration tendency of each of the plurality of used battery units BU on the basis of the deterioration state of each of the plurality of used battery units BU stored in chronological order (S150 of FIG. 6). Various methods can be adopted as a method for acquiring the deterioration tendency of each of the plurality of used battery units BU. For example, the deterioration tendency acquisition unit 159 acquires the values of deterioration states of a most recent predetermined number to obtain an approximation curve, which indicates the chronological change of the deterioration state by using the values thereby to acquire the deterioration tendency of each of the plurality of used battery units BU.

Then, the SOC range determination unit 161 determines the predetermined SOC range of each of the plurality of used battery units BU according to the deterioration tendency of each of the plurality of used battery units BU and stores the predetermined SOC range, which has been determined, in the memory unit 110 (S170 of FIG. 6). The SOC range determination unit 161 may perform the determination each time the recognition processing step is performed, perform once in a plurality of times, for each predetermined period, or at any timing at any time.

As described above, the SOC range determination unit 161 regularly or irregularly determines the predetermined SOC range of each of the plurality of used battery units BU. This series of processing steps is performed and the recognition processing step is terminated.

<Selection Processing Step>

When the selection processing step is started, the selection unit 151 selects a discharge target battery unit DBU to be discharged (S310 of FIG. 7) and selects the charge target battery unit CBU to be charged (S330 of FIG. 7) from among a plurality of used battery units BU on the basis of the recognition results obtained by the recognition units 170 and the predetermined SOC range of each of the plurality of used battery units BU stored in the memory unit 110, and then terminates the processing step.

The selection unit 151, for example, identifies used battery units BU having current SOC values that are larger than the lower limit value of the SOC of the used battery unit BU among the plurality of used battery units BU.

Then, the selection unit 151 selects, as the discharge target battery unit DBU, a used battery unit BU having a largest value obtained by subtracting the value of a charge amount corresponding to the lower limit value of the SOC of the used battery unit BU from the value of the current charge amount of each of the identified used battery units BU. At this time, the selection unit 151 preferentially selects, as the discharge target battery unit DBU, a used battery unit BU having a current SOC value that is larger than the upper limit value of the SOC of the used battery unit BU among the used battery units BU.

Further, the selection unit 151 selects, for example, a used battery unit BU having a smallest current SOC value as the charge target battery unit CBU. At this time, the selection unit 151 preferentially selects, as the charge target battery unit CBU, a used battery unit BU having a current SOC value that is smaller than the lower limit value of the SOC of the used battery unit BU among the used battery units BU.

<Charge/Discharge Control Processing Step>

When the charge/discharge control processing step is started, the charge/discharge control unit 153 causes the discharge target battery unit DBU to be discharged and charges the discharged power into the charge target battery unit CBU such that the SOCs of the discharge target battery unit DBU and the charge target battery unit CBU reach the predetermined SOC range.

More specifically, for example, the charge/discharge control unit 153 starts the discharge from the discharge target battery unit DBU (S510 of FIG. 8) and also starts charging the charge target battery unit CBU with the discharged power (S530 of FIG. 8).

Thereafter, the charge/discharge control unit 153 stops the discharge from the discharge target battery unit DBU (S590 of FIG. 8) when the SOC of the discharge target battery unit DBU reaches or comes close by a predetermined degree to the lower limit value of a predetermined SOC range (Yes in S550 of FIG. 8). Then, for example, the charge/discharge control unit 153 stops charging the charge target battery unit CBU (S590 of FIG. 8) when the SOC of the charge target battery unit CBU reaches or comes close by a predetermined degree to the upper limit value of the predetermined SOC range (Yes in S570 of FIG. 8).

Meanwhile, if the SOC of the discharge target battery unit DBU has not reached or has not become close by the predetermined degree to the lower limit value of the predetermined SOC range (No in S550 of FIG. 8) and if the SOC of the charge target battery unit CBU has not reached or has not become close by the predetermined degree to the upper limit value of the predetermined SOC range (No in S570 of FIG. 8), then the charge/discharge control unit 153 continues the discharge from the discharge target battery unit DBU and charging the charge target battery unit CBU with the discharged power. This series of processing steps is performed, and the charge/discharge control processing step is terminated.

As described above, according to the storage for used battery units of the present embodiment, it is possible to provide a storage for used battery units that is capable of economically storing a plurality of used battery units of various manufacturers while suppressing the deterioration of the used battery units during storage.

<Other Embodiments>

The above has described an embodiment of the present invention; however, the present invention is not limited thereto. Various modifications can be made without departing from the spirit of the present invention. Further, as necessary, some functions or processing steps may be omitted, or the order of the processing steps may be changed.

For example, the selection unit 151 may be configured such that, if the amount of power discharged from the discharge target battery unit DBU is insufficient for the amount of power required to charge the charge target battery unit CBU to the predetermined SOC range, then the charge unit 30 is selected as the power source that supplies power to cover the insufficient power.

In this case, the charge/discharge control unit 153 is configured to cause the discharge target battery unit DBU to be discharged or discharge the charge unit 30 to be discharged, and charge the charge target battery unit CBU with the discharged power such that the SOCs of the discharge target battery unit DBU and the charge target battery unit CBU reach the predetermined SOC range.

The following will describe a case where, for example, the amount of power required to charge the charge target battery unit CBU to the predetermined SOC range is 10 kWh, and the amount of power that can be discharged from a used battery unit BU selected first as the discharge target battery unit DBU (e.g., when discharged to the lower limit value of the predetermined SOC of the used battery unit BU) is 4 kWh.

In this case, the selection unit 151 selects one or more used battery units BU that can discharge power as a second, a third and so on discharge target battery units DBU, because the amount of power is insufficient by 6 kWh to charge the charge target battery unit CBU to be within the predetermined SOC.

If the amount of power is still insufficient to meet the required amount of power for charging the charge target battery unit CBU to the lower limit value of the predetermined SOC, then the selection unit 151 selects the charge unit 30 as the power source that supplies power to cover the insufficiency.

Further, the charge/discharge control unit 153 causes the used battery unit BU selected first as the discharge target battery unit DBU, the second discharge target battery unit DBU, the third discharge target battery unit DBU and so on to be discharged in order and then causes the charge unit 30 to be discharged, and charges the discharged power into the charge target battery unit CBU. Subsequently, when the SOC of the charge target battery unit CBU reaches the predetermined SOC range, the charge/discharge control unit 153 terminates the discharge from the charge unit 30 and the charging of the charge target battery unit CBU.

Alternatively, for example, the selection unit 151 may be configured to select the power output unit 50 as the target to which the excess power is to be supplied if the amount of power discharged from the discharge target battery unit DBU exceeds the amount of power required to charge the charge target battery unit CBU to the upper limit of the predetermined SOC range.

In this case, the charge/discharge control unit 153 is configured to cause the discharge target battery unit DBU to be discharged such that the SOCs of the discharge target battery unit DBU and the charge target battery unit CBU become the predetermined SOC range, and charge the discharged power into the charge target battery unit CBU or supply the discharged power to the power output unit 50.

The following will describe a case where, for example, the amount of power required to charge the charge target battery unit CBU to the upper limit value of the predetermined SOC range is 7 kWh, and the amount of power discharged from a used battery unit BU selected first as the discharge target battery unit DBU to the upper limit value of the predetermined SOC of the used battery unit BU is 10 kWh.

In this case, there will be a 3 kWh excess amount of power even after charging the charge target battery unit CBU to the upper limit value of the predetermined SOC, so that the selection unit 151 selects, as a second, a third and so on charge target battery units CBU, one or more used battery units BU which can be charged with power, that is, which still have allowances before reaching the upper limit value of the predetermined SOC of the used battery units BU.

If there is still an excess amount of power for discharging the discharge target battery unit DBU to the upper limit value of the predetermined SOC even after the used battery units BU selected as the second, the third and so on charge target battery units CBU are charged to the upper limit value of the predetermined SOC as described above, the selection unit 151 selects the power output unit 50 as the target to which the excess power is supplied.

Further, the charge/discharge control unit 153 charges the used battery unit BU selected first as the charge target battery unit CBU, the second charge target battery unit CBU, the third charge target battery unit CBU and so on in order from the discharge target battery unit DBU, and then supplies the power to the power output unit 50. Subsequently, when the SOC of the discharge target battery unit DBU reaches the predetermined SOC range, the charge/discharge control unit 153 terminates the discharge from the discharge target battery unit DBU and the supply of power to the power output unit 50.

In this case, the charge/discharge control unit 153 may be configured to supply the power supplied to the power output unit 50 as the power required for operating the storage for used battery units.

Alternatively, for example, the selection unit 151 may be configured to select, as the discharge target battery unit DBU, a used battery unit BU having a highest SOC among the plurality of used battery units BU and to select the power output unit 50 as the target to which the power discharged from the discharge target battery unit DBU is supplied when the input of a power output instruction from the power output unit 50 by the user is accepted by the power output instruction reception unit 155.

In this case, the charge/discharge control unit 153 is configured to cause the discharge target battery unit DBU to be discharged such that the discharge target battery unit DBU reaches the SOC range thereof and to supply the discharged power to the power output unit 50.

Although the above has described the embodiment in which the memory unit 110, the storage control unit 150, and the input unit 190 are configured integrally with the storage main body 10, the present invention is not limited thereto. All or some of the memory unit 110, the storage control unit 150, and the input unit 190 may be configured of a device, such as a computer, separate from the storage main body 10.

More specifically, for example, the memory unit 110 may be provided in a computer communicably connected with the storage main body 10 through a communication network, such as a LAN (Local Area Network), a WAN (Wide Area Network), or the Internet communication network.

DESCRIPTION OF REFERENCE NUMERALS

10 . . . storage main body; 30 . . . charge unit; 50 . . . power output unit; 110 . . . memory unit; 130 . . . connection circuit; 150 . . . storage control unit; 151 . . . selection unit; 153 . . . charge/discharge control unit; 155 . . . power output instruction reception unit; 157 . . . deterioration state acquisition unit; 159 . . . deterioration tendency acquisition unit; 161 . . . SOC range determination unit; 170 . . . recognition unit; 190 . . . input unit; and BU . . . used battery unit.

The invention claimed is:
1. A storage for storing a plurality of used battery units, the storage comprising:
 a memory unit that stores a predetermined SOC (State of Charge) range according to characteristics of each of the plurality of used battery units;
 a connection circuit that electrically connects the plurality of used battery units with each other;
 a recognition unit which is connected to the plurality of used battery units in storage and which recognizes a current value and a voltage value of each of the plurality of used battery units;
 a selection unit that selects a discharge target battery unit to be discharged and a charge target battery unit to be charged from among the plurality of used battery units based on a recognition result by the recognition unit and the predetermined SOC range of each of the plurality of used battery units stored in the memory unit;
 a charge/discharge control unit which causes the discharge target battery unit to be discharged and the discharged power to be charged into the charge target battery unit such that the SOCs of the discharge target battery unit and the charge target battery unit reach the predetermined SOC range; and
 a power output unit which is electrically connected to the connection circuit and outputs power supplied from the plurality of used battery units,
 wherein:
 the selection unit is configured such that, in a case where an amount of power to be discharged from the discharge target battery unit exceeds an amount of power required to charge the charge target battery unit to an upper limit of the predetermined SOC range thereof, the power output unit is selected as a target to which the excess power is supplied, and the charge/discharge control unit is configured to cause the discharge target battery unit to be discharged and to charge the discharged power into the charge target battery unit or supply the discharged power to the power output unit such that the SOCs of the discharge target battery unit and the charge target battery unit reach the predetermined SOC range.

2. The storage according to claim 1, further including:
a power output instruction reception unit which accepts input of a power output instruction from the power output unit by a user,
wherein:
the selection unit is configured such that, in a case where the input of the output instruction is accepted by the power output instruction reception unit, the used battery unit having a highest SOC among the plurality of used battery units is selected as the discharge target battery unit, and the power output unit is selected as a target to which power discharged from the discharge target battery unit is supplied, and
the charge/discharge control unit is configured to cause the discharge target battery unit to discharge to be within a SOC range of the discharge target battery unit, and to supply the discharged power to the power output unit.

3. The storage according to claim 1, wherein the charge/discharge control unit is configured to supply power supplied to the power output unit as power required for operating the storage.

4. The storage according to claim 1, further including:
a deterioration state acquisition unit that acquires a deterioration state of each of the plurality of used battery units and stores the acquired deterioration state in chronological order in the memory unit;
a deterioration tendency acquisition unit that acquires a deterioration tendency of each of the plurality of used battery units based on the deterioration state stored in chronological order; and
a SOC range determination unit that regularly or irregularly determines the predetermined SOC range of each of the plurality of used battery units according to the deterioration tendency of each of the plurality of used battery units, and stores, in the memory unit, the predetermined SOC range that has been determined.

5. A storage for storing a plurality of used battery units, the storage comprising:
a memory unit that stores a predetermined SOC (State of Charge) range according to characteristics of each of the plurality of used battery units;
a connection circuit that electrically connects the plurality of used battery units with each other;
a recognition unit which is connected to the plurality of used battery units in storage and which recognizes a current value and a voltage value of each of the plurality of used battery units;
a selection unit that selects a discharge target battery unit to be discharged and a charge target battery unit to be charged from among the plurality of used battery units based on a recognition result by the recognition unit and the predetermined SOC range of each of the plurality of used battery units stored in the memory unit;
a charge/discharge control unit which causes the discharge target battery unit to be discharged and the discharged power to be charged into the charge target battery unit such that the SOCs of the discharge target battery unit and the charge target battery unit reach the predetermined SOC range; and
a charge unit which is electrically connected to the connection circuit and charges the plurality of used battery units,
wherein:
the selection unit is configured to select the charge unit as a power source supplying power that covers insufficient power in a case where an amount of power discharged from the discharge target battery unit is insufficient for an amount of power required to charge the charge target battery unit to the predetermined SOC range, and
the charge/discharge control unit is configured to cause the discharge target battery unit to be discharged or the charge unit to be discharged, and to charge the discharged power into the charge target battery unit such that the SOCs of the discharge target battery unit and the charge target battery unit reach the predetermined SOC range.

* * * * *